US008871302B2

(12) United States Patent
Teng et al.

(10) Patent No.: US 8,871,302 B2
(45) Date of Patent: Oct. 28, 2014

(54) CHEMICAL VAPOR DEPOSITION OF GRAPHENE ON DIELECTRICS

(75) Inventors: Po-Yuan Teng, New Taipei (TW);
Yung-Chang Lin, Hsinchu (TW);
Po-Wen Chiu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 112 days.

(21) Appl. No.: 13/592,957

(22) Filed: Aug. 23, 2012

(65) Prior Publication Data
US 2013/0243969 A1 Sep. 19, 2013

(30) Foreign Application Priority Data

Mar. 14, 2012 (TW) .............................. 101108760 A (51) Int. Cl.
*C23C 16/26* (2006.01)
(52) U.S. Cl.
USPC .................................. 427/249.1; 427/255.23
(58) Field of Classification Search
USPC .............................. 427/249.1, 249.16, 255.23
See application file for complete search history.

(56) References Cited

U.S. PATENT DOCUMENTS

| 2009/0029543 | A1* | 1/2009 | Rothwell et al. ............... 438/631 |
| 2009/0181502 | A1 | 7/2009 | Parikh et al. |
| 2009/0283735 | A1* | 11/2009 | Li et al. .............................. 257/1 |
| 2010/0127312 | A1 | 5/2010 | Grebel et al. |
| 2010/0224851 | A1* | 9/2010 | Colombo et al. .................. 257/9 |
| 2011/0034011 | A1 | 2/2011 | Ma |
| 2011/0091647 | A1* | 4/2011 | Colombo et al. .......... 427/249.1 |
| 2011/0210314 | A1* | 9/2011 | Chung et al. .................... 257/29 |
| 2011/0227043 | A1* | 9/2011 | Guo et al. ........................ 257/24 |
| 2011/0269299 | A1* | 11/2011 | Zhang et al. ................... 438/478 |
| 2012/0168721 | A1* | 7/2012 | Kelber et al. .................... 257/29 |
| 2013/0001515 | A1* | 1/2013 | Li et al. ............................ 257/24 |
| 2013/0056703 | A1* | 3/2013 | Elian et al. ........................ 257/9 |
| 2013/0099195 | A1* | 4/2013 | Seacrist et al. .................... 257/9 |
| 2013/0113081 | A1* | 5/2013 | Chen et al. ..................... 257/602 |
| 2013/0174968 | A1* | 7/2013 | Vlassiouk et al. ............. 156/155 |
| 2013/0243969 | A1* | 9/2013 | Teng et al. ..................... 427/539 |

OTHER PUBLICATIONS

Drabinska, A., et al., "Growth kinetics of epitaxial graphene on SiC substrates". Physical Review B 81, 245410 (2010), pp. 1-4.*
Strupinski, W., et al., "Graphene Epitaxy by Chemical Vapor Deposition on SiC". Nano Lett. 2011, 11, 1786-1791.*
Guermoune, Abdeladim, et al., "Chemical vapor deposition synthesis of graphene on copper with methanol, ethanol, and propanol precursors". Carbon 49 (2011) 4204-4210.*
Mattevi, Cecilia, et al., "A review of chemical vapour deposition of graphene on copper". Journal of Materials Chemistry, 2011, 21 3324-3334.*
Teng, P.-Y., Lu, C.-C., Kotone, A.-H., Lin, Y.-C., Yeh, C.-H., Suenaga, Kazu, and C, P.-W., Remote Catalyzation for Direct Formation of Graphene Layers on Oxides, Nano letters, ACS Publications; American Chemical Society; Feb. 14, 2012, 12, 1379-1384.

* cited by examiner

*Primary Examiner* — Bret Chen
(74) *Attorney, Agent, or Firm* — Muncy, Geissler, Olds & Lowe, P.C.

(57) ABSTRACT

A method for synthesizing graphene films is disclosed. Monolayer or multilayer graphene can be directly grown on the dielectric materials. The method includes the following steps: disposing dielectric materials and metals in a reactor, introducing reaction gases into the reactor and decomposing the reaction gases by heating, thus directly depositing graphene films on the surfaces of the dielectrics. High crystalline quality and low-defect graphene films can be synthesized directly on dielectric materials, without the process of wet etching and transfer. The method opens up a more direct route to apply graphene on electronics, optoelectronics, and bio-medical devices.

11 Claims, 12 Drawing Sheets

CHEMICAL VAPOR DEPOSITION OF GRAPHENE ON DIELECTRICS

CROSS REFERENCE TO RELATED APPLICATIONS

This Non-provisional application claims priority under 35 U.S.C. §119(a) on Patent Application No(s). 101108760 filed in Taiwan, Republic of China on Mar. 14, 2012. The entire contents of which are hereby incorporated by reference.

BACKGROUND OF THE INVENTION

1. Field of Invention

The invention relates to a method of growing graphene and, in particular, to a method of growing graphene on the surfaces of the dielectrics by means of chemical vapor deposition.

2. Related Art

Graphene is a two-dimensional structure consisting of a single atomic layer of $sp^2$ carbon atoms arranged in a honeycomb lattice. Graphene has a bond length of 0.142 nm and a thickness of 0.34 nm, and is the most basic structure among various carbon isotopes, including fullerenes, carbon nanotubes and graphite. The exotic properties of graphene, especially its high carrier mobility (5000 to 10000 $cm^2/Vs$), hardness (1050 Gpa), thermal conductivity (5000 W/mk), current carrying capacity ($10^8$ $A/cm^2$) and extremely large surface-to-volume ratio (2630 $m^2/g$), have prompted research interest into graphene's applications in the next generation of bio-medical, electronic and optoelectronics devices. As a result, graphene has been considered a leading candidate for integration into conventional electronic and optoelectronic devices, and increasing amounts of capital and resources are being devoted to develop industrial fabrication and implementation methods.

Conventional approaches to obtain graphene mainly include mechanical exfoliation, high-temperature pyrolysis of silicon carbide and chemical vapor deposition (CVD). Although mechanical exfoliation can be used to fabricate high-quality single crystalline graphene on desired substrates, the size and thickness of the resulting graphene flakes are limited and cannot be scaled up. The high-temperature pyrolysis of silicon carbide, however, requires sophisticated high vacuum and high temperature (1300 to 1600° C.) conditions in the growth process, which is not cost-effective. Both approaches are costly and have trouble producing large-area graphene for the industrial applications.

Recently, CVD graphene has been successfully grown on various transition metals, such as cobalt, nickel, copper, etc. In the growth process, the carbon-containing gases are heated to 800-1400° C. and catalyzed by the transition metal to be decomposed. Depending on the various catalytic effects of the transition metals on the hydrocarbon molecules and their corresponding carbon solubility, the decomposed carbon atoms cause different degrees of deposition, dissolution and precipitation on the surface of the transition metal substrate. Nickel has a better catalytic capability, higher carbon solubility and low processing temperature (about 800 to 900° C.), but it is difficult to control the carbon precipitation rate as the temperature falls, resulting in a non-uniform thickness of the graphene film grown on the nickel surface. Copper is a less effective catalyst, with only the copper atoms on the outer layer exhibiting catalytic capability and the capacity to dissolve carbons. Thus, after the carbon source is exposed to the copper surface for decomposition, the dissolved carbon atoms immediately precipitate onto the substrate surface, followed by graphitization. When the carbon atoms covering the copper surface form a continuous graphene film, this film provides a protective shield, thus the metal surface loses its capability to catalyze the decomposition of the subsequently introduced hydrocarbon molecules. This self-limiting growth mechanism restricts the graphene layers grown on the copper surface to a 90% monolayer coverage, and represents a major breakthrough in the growth of large-area graphene films. However, a catalytic metal substrate is always necessary to obtain the high crystalline quality of graphene film obtained by chemical vapor deposition. To electrically isolate the graphene film, the metal substrate has to be removed by wet (acid) etching, and the graphene film is then transferred to an insulating substrate with the aid of a thin polymer scaffold. Unfortunately, the graphene film is often damaged by the strong acid in the etching process. The acidic chemical groups may be readily bonded to the graphene, changing its physical properties. Wrinkles or cracks may also result from the transfer process. Following the etching process residual metal particles, which scatter electrons and hence reduces electron mobility, inevitably remain on the graphene surface. In addition, prior to the etching process, an organic polymer layer has to be coated on the graphene surface to serve as a scaffold. This polymer film is usually comprised of long-chain hydrocarbons and, once these molecules come into contact with the graphene, they are difficult to be removed using any known organic solvent. The graphene surface is obscured by a thin layer of residual polymer, shielding the graphene from contact with the surrounding environment, thus throttling the high sensitivity of the graphene to environmental variation. This hinders graphene's use in applications such as sensors.

If the hydrocarbon gas is decomposed by microwaves, plasma or high-energy cyclotron electrons prior to chemical vapor deposition, graphene can be grown at a lower temperature and can be even grown on the surface of oxides or insulating layers. Thus, it is possible to bypass the wet transfer, which is an essential step in chemical vapor deposition for forming the graphene on the metal surfaces. However, due to the presence of high-energy hydrocarbon radicals, the graphene grown on the surface of the insulating substrate exhibits very high density of defects. Although the etching process is bypassed, the quality of the resulting graphene films cannot equal that fabricated by conventional chemical vapor deposition on metal substrates, thereby restricting its application and development.

Therefore, a novel technique that allows direct growth of low-defect graphene films on the surface of the insulating substrate by chemical vapor deposition would represent a significant breakthrough. Such an approach can result in large-area and high-quality graphene films as produced by mechanical exfoliation, thus allowing for practical applications in bio-medical, electronic and optoelectronic devices.

SUMMARY OF THE INVENTION

In view of the foregoing techniques, the objective of the current invention is to provide a technique for directly growing large-area graphene on insulating layers or on oxide surfaces by chemical vapor deposition without sacrificing high crystalline quality.

To achieve the above-mentioned objective, the present invention discloses a method of growing graphene by means of chemical vapor deposition. The method includes the following steps: disposing metals and dielectric substrates in a reactor wherein a gap is formed between the metals and the dielectrics, introducing reaction gases into the reactor; heating the reaction gases to be decomposed, and depositing graphene films on the surface of the dielectrics.

In one embodiment, the metal material are copper, nickel, zinc or an alloy containing copper, nickel and/or zinc.

In one embodiment, the dielectrics comprise silicon dioxide, quartz, sapphire, glass, sodium chloride, silicon nitride or their combinations.

In one embodiment, the gap ranges from 0 to 65 cm.

In one embodiment, the reaction gases comprise hydrogen and a carbon-containing gas.

In one embodiment, the carbon-containing gas comprises methane, acetylene, ethylene, benzene, carbon monoxide or carbon dioxide.

In one embodiment, the method further includes the step of introducing an inert gas into the reactor.

In one embodiment, the gas flow rate of the inert gas ranges from 5 to 3000 sccm, the gas flow rate of the hydrogen ranges from 5 to 1000 sccm, and the gas flow rate of the carbon-containing gas ranges from 5 to 1000 sccm.

In one embodiment, prior to disposing the dielectrics in the reactor, the method further includes the step of treating the dielectrics using oxygen plasma.

In one embodiment, prior to the step of disposing the metals in the reactor, the method further includes the step of treating the metals using an acid.

In one embodiment, the decomposition temperature of the reaction gases ranges from 200° C. to 1200° C.

In one embodiment, the films deposited on the surfaces of the dielectrics are graphene or multilayer graphene.

In one embodiment, no metal residues are left on the graphene or multilayer graphene deposited on the surfaces of the dielectrics.

In one embodiment, seeds of graphite or graphene are disposed on the dielectrics before the dielectrics are disposed in the reactor.

To achieve the above-mentioned objective, the present invention also discloses a method of growing graphene by means of chemical vapor deposition. The method includes the following steps: disposing metals and dielectrics in a reactor wherein the metals abut upon the dielectrics, introducing reaction gases into the reactor, heating the reaction gases to be decomposed, and depositing graphene films on the surfaces of the dielectrics.

In one embodiment, the reaction gases comprise hydrogen and a carbon-containing gas.

In one embodiment, the method further includes the step of introducing an inert gas into the reactor.

In one embodiment, the gas flow rate of the inert gas ranges from 5 to 3000 sccm, the gas flow rate of the hydrogen ranges from 5 to 1000 sccm, and the gas flow rate of the carbon-containing gas ranges from 5 to 1000 sccm.

In one embodiment, the films deposited on the surfaces of the dielectrics are graphene or multilayer graphene.

In one embodiment, no metal residues are left on the graphene or multilayer graphene deposited on the surfaces of the dielectrics.

As mentioned above, the invented method of growing graphene by chemical vapor deposition uses metal particles in a gas phase as the catalyst, which are evaporated from the metals in the high-temperature reactor environment, so that the carbon-containing gas introduced into the reactor is catalyzed and decomposed by the vaporized metal particles, followed by the graphitization of carbon atoms on the surfaces of the dielectrics, thus allowing for the formation of the high-quality graphene films. Therefore, the graphene films can be grown over a large area of the dielectric substrates with high crystallinity and low defects.

BRIEF DESCRIPTION OF THE DRAWINGS

A better understanding of the present invention can be obtained when the following detailed description is considered in conjunction with the following drawings, in which.

DETAILED DESCRIPTION OF THE INVENTION

Figure 1A:
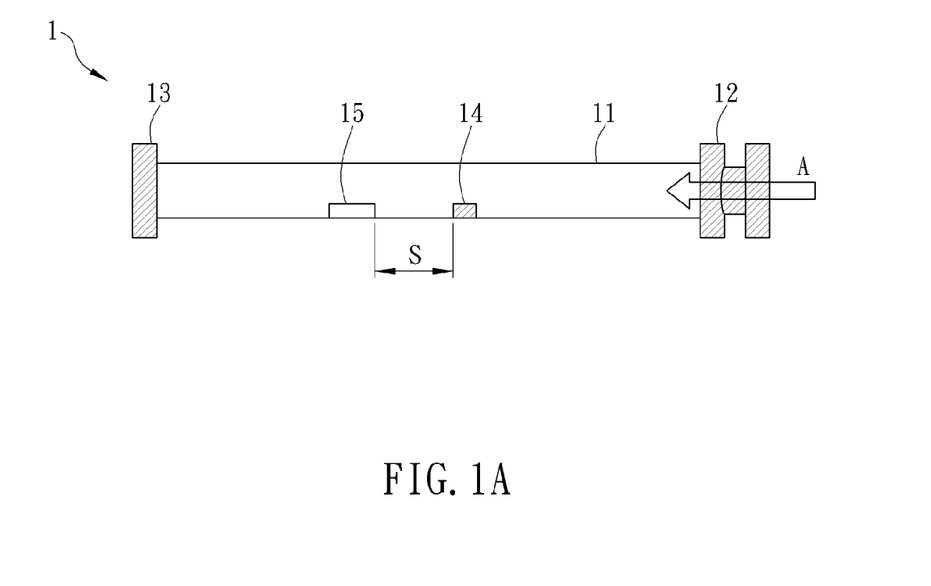
FIG. 1A is a schematic illustration showing a process apparatus for growing graphene by chemical vapor deposition according to a preferred embodiment of the invention.

FIG. 1A is a schematic illustration showing a process apparatus 1 of growing graphene by chemical vapor deposition according to a preferred embodiment of the invention. Referring to FIG. 1A, the process apparatus 1 includes a reactor 11, an intake gate 12 and an exhaust gate 13. In this embodiment, the material of the reactor 11 is composed of quartz, ceramics or stainless steel, and the appearance of the reactor 11 is a long tubular structure with a length ranging from 50 cm to 150 cm and a diameter equal to 5 cm or 10 cm. This long tubular reactor 11 will be disposed in a heating apparatus (not shown), and the temperature inside the heating apparatus is controllable from 20° C. to 1500° C. The intake gate 12 is disposed on one end of the reactor 11, while the exhaust gate 13 is disposed on the other end of the reactor 11. The method of growing graphene by chemical vapor deposition according to a preferred embodiment of the invention includes the following steps: disposing metals and dielectric substrates on the reactor 11 wherein a gap is formed between the metals and the dielectrics, introducing reaction gases into the reactor 11, heating the reaction gases to be decomposed, and depositing graphene films on the surfaces of the dielectrics.

Figure 1B:
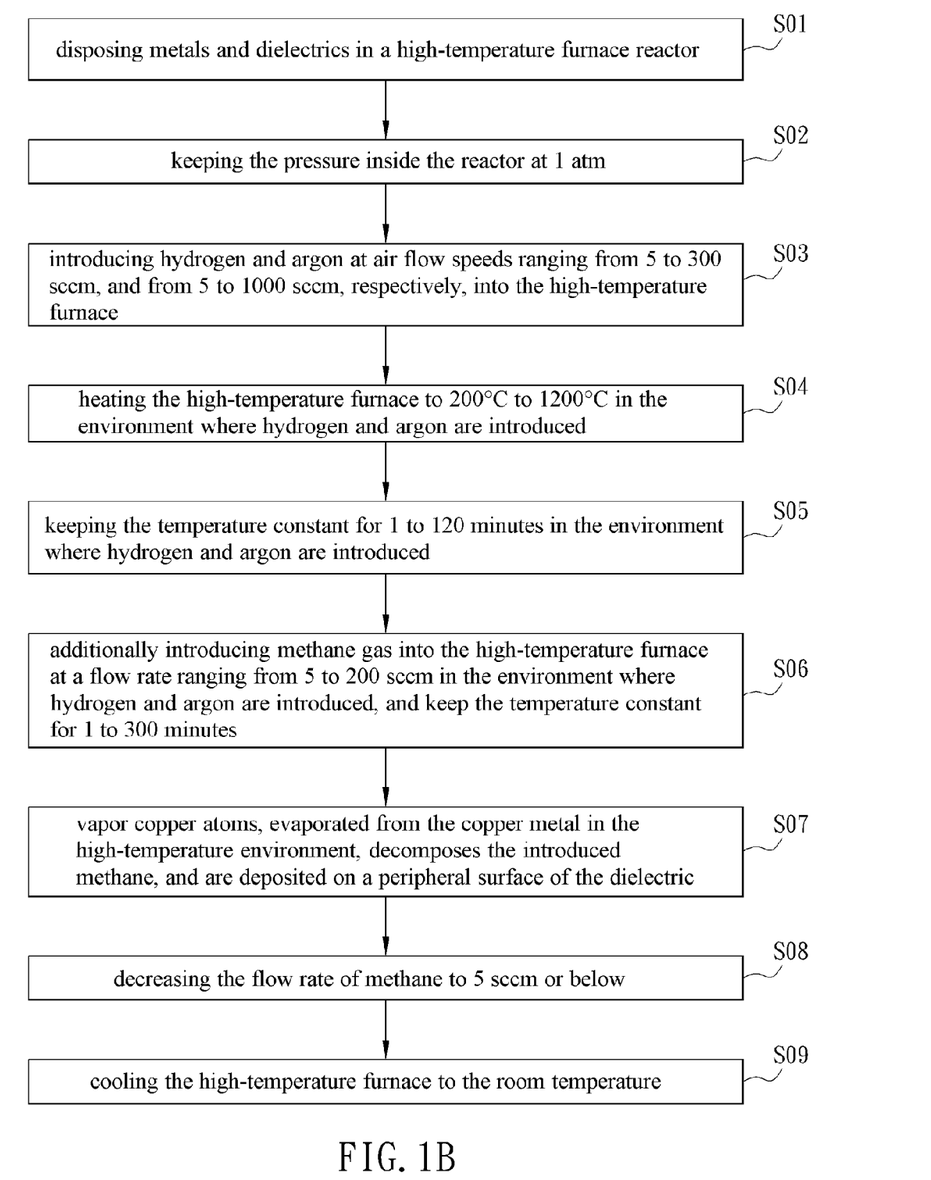
FIG. 1B is a flow chart showing a method of growing graphene by chemical vapor deposition according to the preferred embodiment of the invention.

The method of growing graphene by chemical vapor deposition according to a preferred embodiment of the invention is described hereinafter with reference to FIG. 1B in view of FIG. 1A. The method of growing the graphene includes steps S01 to S09.

In step S01, metals 14 and dielectrics 15 are disposed in the reactor 11. Herein, the reactor 11 is a high-temperature furnace reactor and generally made of quartz, so that it is inert during the reaction. The metals 14 are the source of the catalytic metal particles in a gas phase. At temperatures ranging from 200° C. to 1200° C., metal particles evaporate from the surfaces of the metals 14 and float toward the dielectrics 15. In practice, the metals 14 may be copper, nickel, zinc or an alloy containing copper, nickel and zinc, while the dielectric 15 may be comprised of silicon dioxide, quartz, sapphire, glass, sodium chloride, silicon nitride or a combination thereof. In this embodiment, the metals 14 are copper foils with a thickness of 150 μm, the dielectrics 15 is silicon chips with silicon dioxide on top, and a gap S ranging from 0 to 65 cm is made between the metals 14 and the dielectrics 15.

In practice, the number of metals 14 and dielectrics 15 is optional depending on actual requirements and the specification of the process apparatus 1. For example, the available options may include a metal 14 and multiple dielectrics 15, multiple metals 14 and a single dielectric 15, or multiple metals 14 and dielectrics 15.

Figure 2A:
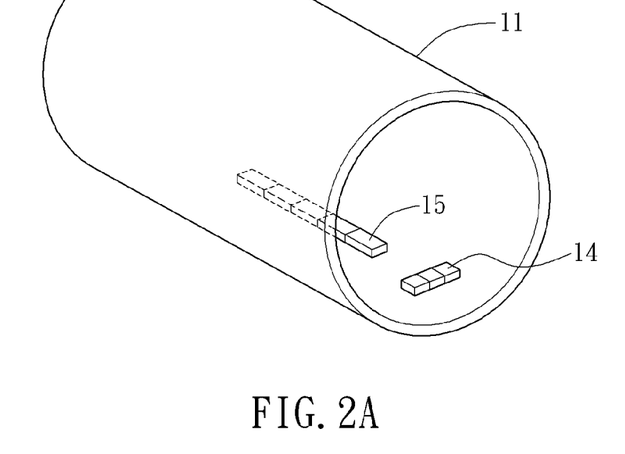
FIGS. 2A to 2G are schematic illustrations showing different arrangements of the metals and dielectrics according to the preferred embodiment of the invention.
Figure 2B:
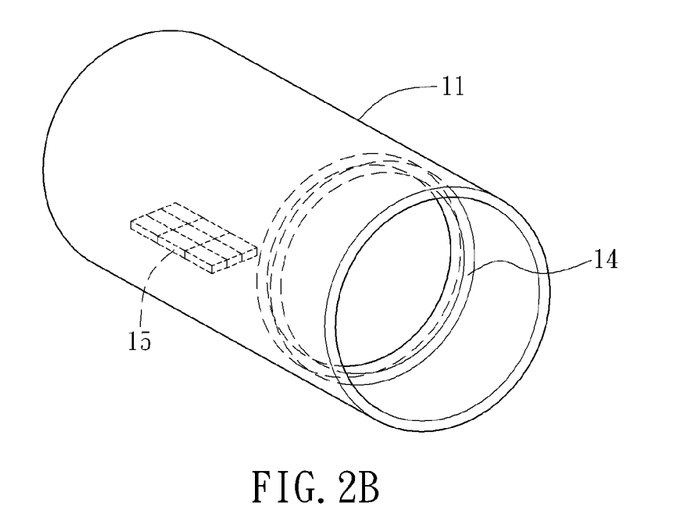
Figure 2C:
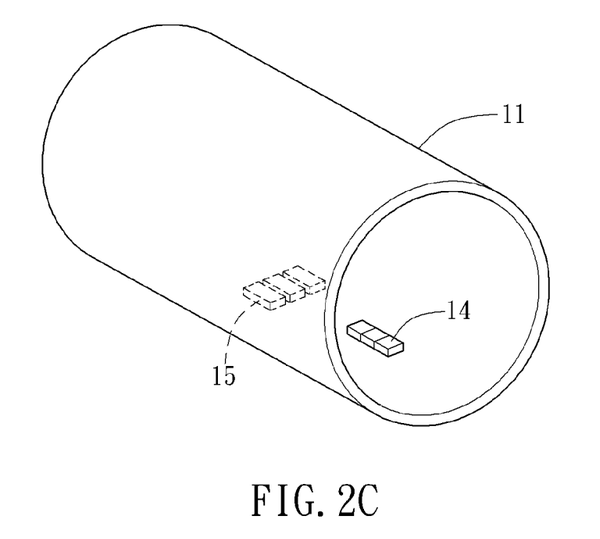

Various arrangements of the metals 14 and the dielectrics 15 are described with reference to FIGS. 2A to 2G in view of FIG. 1A. As shown in FIG. 2A, the metals 14 and the dielectrics 15 are horizontally placed on the bottom of the reactor 11. The metals 14 are disposed side by side in a lateral direction of the reactor 11. The dielectrics 15 are sequentially arranged along the axial direction of the reactor 11 and abut one another. In this embodiment, the metals 14 are nearer to the intake gate than to the dielectrics 15. As shown in FIG. 2B, the metals 14 are disposed along an inner wall of the reactor 11 and the dielectrics 15 are arranged in an array and abut one another. As shown in FIG. 2C, the metals 14 are sequentially arranged along the axial direction of the reactor 11, and the dielectrics 15 are separately arranged side by side.

Figure 2D:
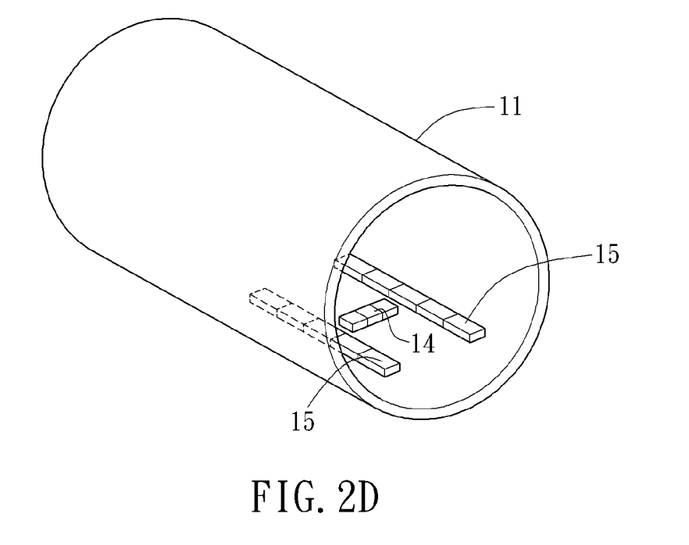
Figure 2E:
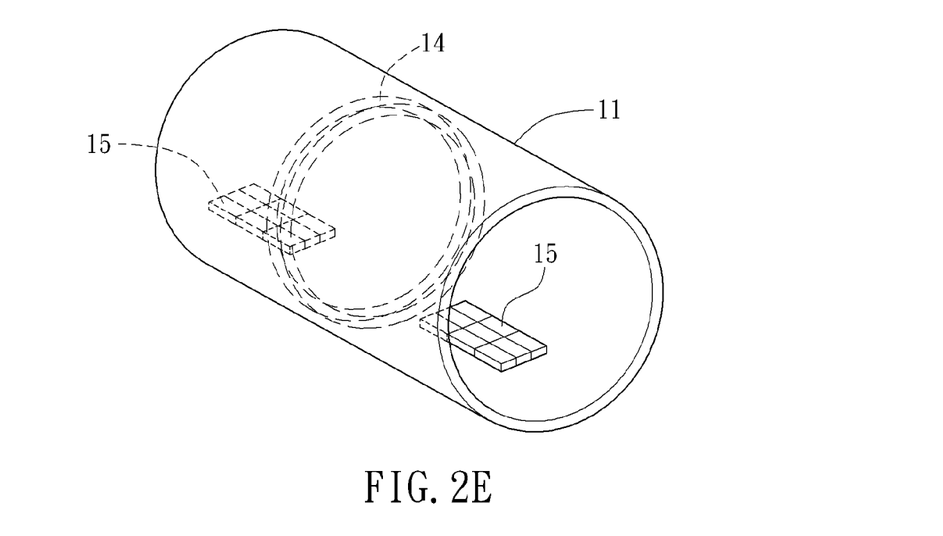
Figure 2F:
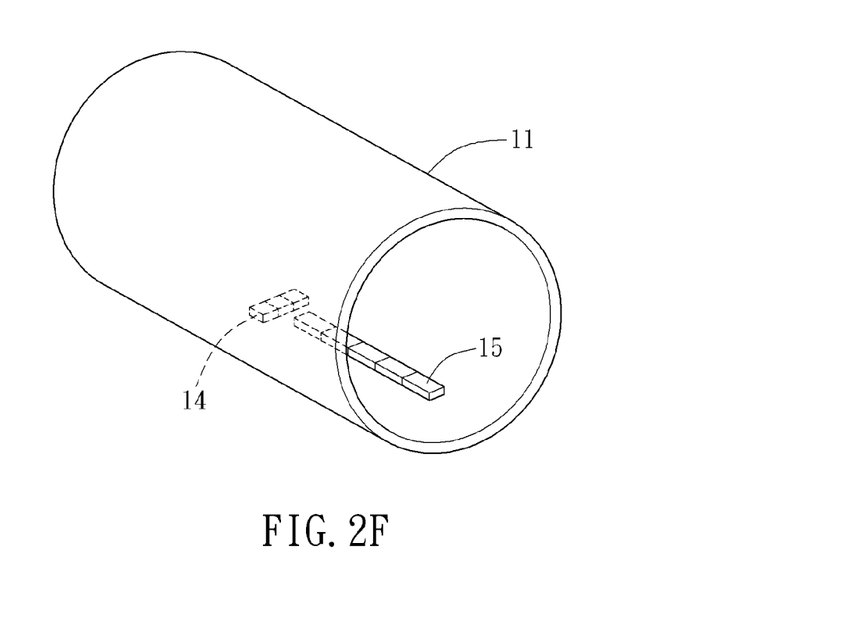
Figure 2G:
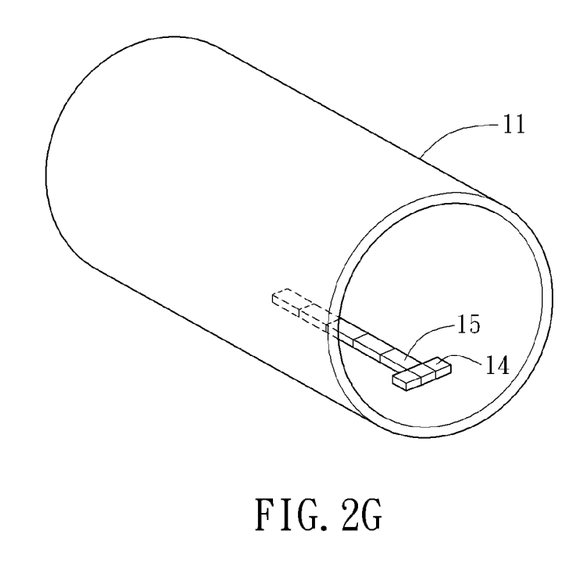

As shown in FIG. 2D, the dielectrics 15 are arranged in two rows, and the metals 14 are disposed side by side between the two rows of dielectrics 15. As shown in FIG. 2E, the metals 14 are disposed along the inner wall of the reactor 11, and the dielectrics 15 are arranged in two arrays, respectively disposed on two sides of the metals 14. As shown in FIG. 2F, the metals 14 and the dielectrics 15 are horizontally placed on the bottom of the reactor 11. The metals 14 are sequentially disposed in the lateral direction of the reactor 11, and the dielectrics 15 are sequentially arranged along the axial direction of the reactor 11. In this embodiment, the dielectrics 15 are nearer to the intake gate than to the metals 14. As shown in FIG. 2G, the metals 14 are sequentially disposed in the lateral direction of the reactor 11, and the dielectrics 15 are sequentially arranged along the axial direction of the reactor 11. The first dielectric 15 is in contact with the row of metals 14.

In step S02, the pressure inside the reactor 11 is kept at 1 atm.

In step S03, a reaction gas A is introduced into the reactor 11. In practice, the reaction gas A is introduced into the reactor 11 from the intake gate 12. The reaction gas is comprised of a carbon-containing gas and hydrogen. The flow rate of hydrogen ranges from 5 to 300 sccm. Meanwhile, an inert gas with a gas flow rate ranging from 5 to 1000 sccm is also introduced into the reactor 11. In this embodiment, the inert gas is argon (Ar).

Figure 3A:
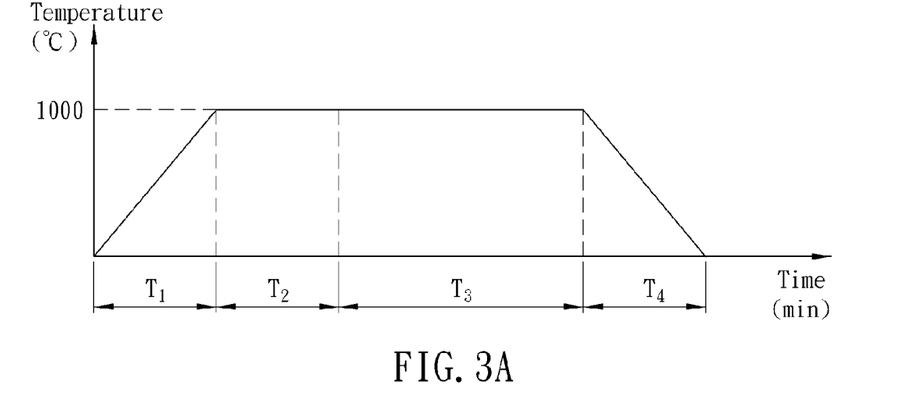
FIGS. 3A to 3C are operation graphs according to the preferred embodiment of the invention.

In step S04, once the flow of the introduced hydrogen and argon becomes stable, the temperature of the reactor 11 is raised from room temperature to between 200° C. and 1200° C. for the preset first operation time $T_1$ according to the temperature rising curve of FIG. 3A.

In step S05, with the flow of hydrogen and argon, the temperature of the reactor 11 is kept constant for 1 to 120 min (the second operation time $T_2$) according to the temperature rising curve of FIG. 3A, allowing for the reduction reaction of the surface oxide of the metals 14.

In step S06, with the flow of hydrogen and argon, a carbon-containing gas is introduced into the reactor 11. The flow rate of carbon-containing gas ranges from 5 sccm to 200 sccm, and the temperature of the reactor 11 is kept fixed according to the temperature rising curve of FIG. 3A. The growth duration lasts for 1 to 300 min. Methane ($CH_4$) may be used as the carbon-containing gas.

In step S07, the surface atoms of the metals 14 (copper foils) in the reactor 11 are evaporated at a high temperature and catalyze the decomposition of carbon-containing gas in the reaction gas A. The carbon atoms are deposited on the surfaces of the dielectrics 15, forming graphene layers on top. In addition to the methane used in this embodiment, the carbon-containing gas may also be acetylene ($C_2H_2$), ethylene ($C_2H_4$), benzene ($C_6H_6$), carbon monoxide (CO) or carbon dioxide ($CO_2$). In addition to the argon used in this embodiment, the inert gas may also be helium (He).

In step S08, the flow rate of the carbon-containing gas is reduced to 5 sccm or below.

In step S09, the temperature of the reactor 11 is decreased to room temperature, i.e., the reactor 11 is cooled to room temperature.

In practice, the gas introduced into the reactor 11 may be changed according to the selected dielectrics 15. For example, when the dielectrics 15 is selected from the group consisting of silicon dioxide, quartz, sapphire and a combination thereof, the introduced gases includes the inert gas (argon) and the reaction gas A, composed of the carbon-containing gas and hydrogen, or the introduced gases includes the inert gas (argon) and the reaction gas A composed of the carbon-containing gas only. When the dielectrics 15 is selected from the group consisting of glass, sodium chloride and a combination thereof, the introduced gas may include the inert gas (argon) and the reaction gas A, composed of the carbon-containing gas and hydrogen, or may only include the reaction gas A composed of the carbon-containing gas and hydrogen.

In addition, the flow rate of the gases introduced into the reactor 11 may be correspondingly adjusted according to the relationship between the metals 14 and the dielectrics 15. For example, a gap S is formed between the metals 14 and the dielectrics 15, or the metals 14 directly abut the dielectrics 15. Otherwise, the metals 14 are disposed upstream of the reaction gas A while the dielectrics 15 are disposed downstream of the reaction gas A, or vice versa. Preferably, the metal 14 is disposed upstream of the reaction gas A while the dielectrics 15 are disposed downstream. Under this arrangement, the gas flow rate of the argon ranges from 5 to 3000 sccm, the gas flow rate of hydrogen ranges from 5 to 1000 sccm, and the gas flow rate of the carbon-containing gas ranges from 5 to 1000 sccm.

Next, the heating temperature for decomposing the reaction gas A may be changed according to the selected dielectrics 15. The heating temperature ranges from 200° C. to 1200° C., most preferably from 750° C. to 1100° C. When the dielectrics 15 are selected from the group consisting of silicon dioxide, quartz, sapphire or a combination thereof, the temperature most preferably ranges from 950° C. to 1050° C. When the dielectrics 15 are selected from the group consisting of glass, sodium chloride and a combination thereof, the temperature most preferably ranges from 780° C. to 800° C.

In this embodiment, the carbon atoms generated through the decomposition are deposited on the surfaces of the dielectrics 15 to form single-layer or multilayer graphene films. The graphene's deposition rate positively correlates to the gas flow rate of the carbon-containing gas in the reaction gas A. That is, an increase in the gas flow rate of the carbon-containing gas in the reaction gas A corresponds with an increase in the graphene's deposition rate. After the deposition, no metal residues are found on the graphene films grown on the surfaces of the dielectrics 15.

Therefore, using the above-mentioned method, the graphene films can be grown directly on the dielectrics 15 without the additional transfer step, thus increasing the growth efficiency of the graphene, simplifying the manufacturing processes, and avoiding the crystal defect caused by the wet transfer step. The resulting graphene films still exhibit the properties of high carrier mobility, high thermal conductivity and high current-carrying capacity. In addition, because the chemical vapor deposition is compatible with current semiconductor manufacturing processes, the invention provides a route toward direct integration of the above-mentioned method of growing graphene with existing semiconductor manufacturing processes.

In addition, to enhance the crystalline quality of the grown graphene, the growth method may also include treating the dielectrics 15 using oxygen plasma, treating the metals 14 using acids, and disposing seeds of graphite or graphene on the dielectrics 15. The treatment of oxide plasma may be performed in advance before the dielectrics 15 are disposed on the reactor 11. In practice, the treatment of oxide plasma is carried out in a vacuum chamber with two parallel electrode plates. Oxygen is then introduced into the chamber, and the two electrode plates are charged to generate 10 to 100 watts of power, turning the oxygen gas into plasma. The surfaces of the dielectrics 15 are cleaned by the reactive oxygen radicals. In addition, when the reactor is equipped with parallel electrode plates, steps S01 to S09 can be performed using the same apparatus.

In practice, the acid treatment step cleans the surfaces of the metals 14 by acids (e.g., acetic acid) before the metals 14 are disposed in the reactor 11, so that the oxide or particles on the surfaces of the metals 14 can be cleaned.

Figure 3B:
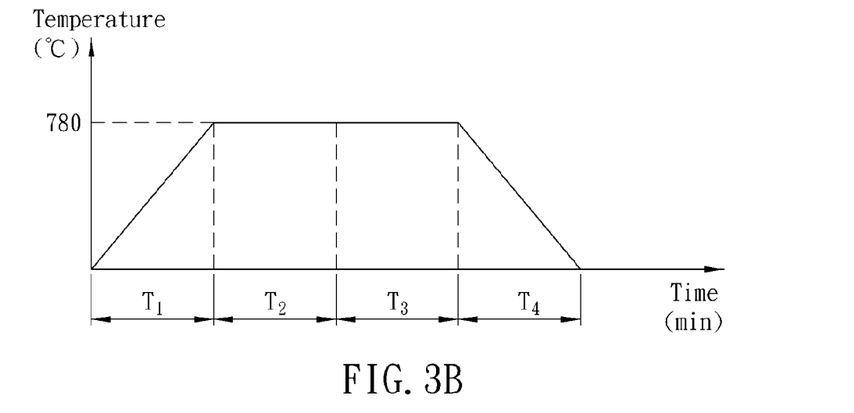
Figure 3C:
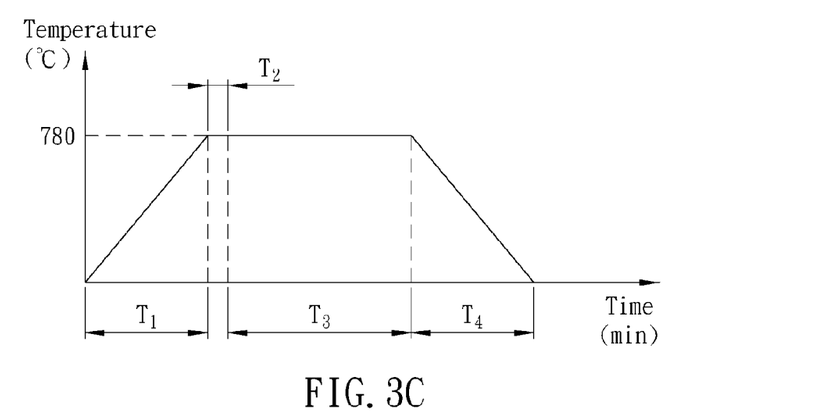

The operation graphs in FIGS. 3A to 3C (corresponding to FIGS. 1A and 1B) describe the operating procedures for growing the graphene when silicon dioxide, glass and sodium chloride are selected as the dielectrics 15.

As shown in the example embodiment in FIG. 3A, the metals 14 are copper and the dielectrics 15 are silicon dioxide. First, the metals 14 and the dielectrics 15 are prepared in the reactor 11. Next, as shown in FIG. 3A, argon and hydrogen are introduced from the intake gate 12 in the first operation time $T_1$, and the temperature is increased to 1000° C. at a rate of 30° C./min. The hydrogen flow rate is 15 sccm, while the argon flow rate is 230 sccm. In the second operation time $T_2$, the temperature is kept at 1000° C., and argon and hydrogen are continuously introduced into the reactor 11.

Next, in a third operation time $T_3$, the carbon-containing gas (e.g., methane) is introduced into the reactor 11. The flow rate of the carbon-containing gas is 30 sccm, while that of hydrogen is 5 sccm and that of argon is 230 sccm. Twenty to 45 min into the third operation time $T_3$, the carbon atoms start depositing on the surfaces of the dielectrics 15, thereby forming graphene films. In the fourth operation time $T_4$, the reactor 11 starts cooling, and only argon and hydrogen are introduced. The pressure used in this embodiment is atmospheric pressure, namely this embodiment is performed in atmospheric pressure chemical vapor deposition (APCVD).

As shown in the example embodiment in FIG. 3B, the metals 14 are copper, and the dielectrics 15 are glass. In the first operation time $T_1$, the argon and hydrogen are introduced and heated to 780° C. The hydrogen flow rate is 100 sccm, and the argon flow rate is 10 sccm. In the second operation time $T_2$, the temperature is kept at 780° C., and the argon and hydrogen are continuously introduced into the reactor 11.

Next, in the third operation time $T_3$, the carbon-containing gas (e.g., methane) is introduced into the reactor 11. The gas flow rate of the carbon-containing gas is 50 sccm, while that for hydrogen is 150 sccm. Thirty min into the third operation time $T_3$, the carbon atoms start depositing on the surfaces of the dielectrics 15, thereby forming graphene films. In the fourth operation time $T_4$, the reactor 11 starts cooling, and only argon is introduced.

As shown in the example embodiment of FIG. 3C, the metals 14 are copper, and the dielectrics 15 are sodium chloride. The dielectrics 15 may be a crystal of sodium chloride or a substrate composed of sodium chloride. In the first operation time $T_1$, the argon and hydrogen are introduced and heated to 780° C. The hydrogen gas flow is 100 sccm, while that of argon is 10 sccm. In the second operation time $T_2$, the temperature is kept at 780° C. and argon and hydrogen are continuously introduced into the reactor 11.

In the third operation time $T_3$, the carbon-containing gas (e.g., methane) is introduced into the reactor 11. The flow rate of the carbon-containing gas is 10 sccm, while that of hydrogen is 100 sccm. Thirty min into the third operation time $T_3$, the carbon atoms start depositing on the surfaces of the dielectrics 15, thereby forming graphene films. In the fourth operation time $T_4$, the reactor 11 starts cooling, and only argon is introduced.

It should be noted that using a different material as the dielectrics 15 may require changes to the temperature, reaction gas A, gas flow rate and growing time. The above-mentioned descriptions are provided only to describe the graphene growth operation, and the invention is not particularly restricted thereto.

The decomposition temperature of the reaction gas A ranges from 200° C. to 1200° C., most preferably between 750° C. and 1100° C. When the dielectrics 15 are selected from the group consisting of silicon dioxide, quartz, sapphire or a combination thereof, the temperature most preferably ranges from 950° C. to 1050° C. When the dielectrics 15 are selected from the group consisting of glass, sodium chloride or a combination thereof, the temperature most preferably ranges from 780° C. to 800° C.

Moreover, the graphene growth method may further include the step of treating the dielectrics 15 using oxygen plasma and the step of disposing seeds of graphite or graphene on the dielectrics 15. The treatment procedure using oxygen plasma may be performed in advance of disposing the dielectrics 15 in the reactor 11. The dielectrics 15 treated with oxygen plasma can have cleaner surfaces, thus improving the crystalline quality of the grown graphene films. To increase the growth rate and improve the quality of the resulting graphene films, seeds made up of graphite or graphene can be disposed on the dielectrics 15 before the dielectrics 15 are disposed in the reactor 11. In practice, the seeds can be adhered to the dielectrics 15, or can be formed on the dielectrics 15 by means of chemical vapor deposition.

Raman spectroscopic analysis is one of the most suitable methods for detecting the crystalline properties of graphene. After the graphene films are directly grown on the surface of the dielectric 15 according to the preferred embodiment of the invention, the properties of the graphene films are analyzed by Raman spectroscopy with an excitation wavelength of 532 nm and a spectral resolution of 1 $cm^{-1}$.

The power of the incident laser beam is about 10 mW, and the laser spot size is 1.5 $\mu m^2$. The G peak of the Raman spectrum is located at ~1580 $cm^{-1}$ in FIG. 4D, and this peak is induced by an in-plane optical phonon $E_{2g}$ near the Brillouin zone center. The D peak of the Raman spectrum shown in FIG. 4D is at about 1350 $cm^{-1}$. This vibrational frequency is activated by crystal defects of the graphene plane, and its intensity indicates the defect density of the graphene film. The 2D peak of the Raman spectrum shown in FIG. 4D is at about 2700 cm$^{-1}$. This peak profile and its intensity can be used to determine the number of graphene layers, but many factors tend to change its full width at half maximum and the position of the peak. Generally speaking, when the number of graphene layers is reduced and the crystalline quality is good, its full width at half maximum is narrow and its intensity is high.

Figure 4A:
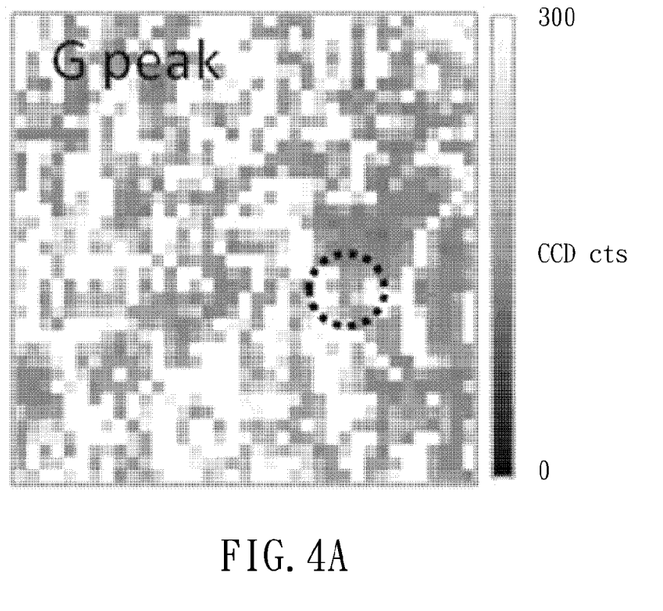
FIGS. 4A to 4C and 4D are respectively the two-dimensional Raman maps and the spectrum of a graphene film grown on the surface of the silicon oxide according to the preferred embodiment of the invention.
Figure 4B:
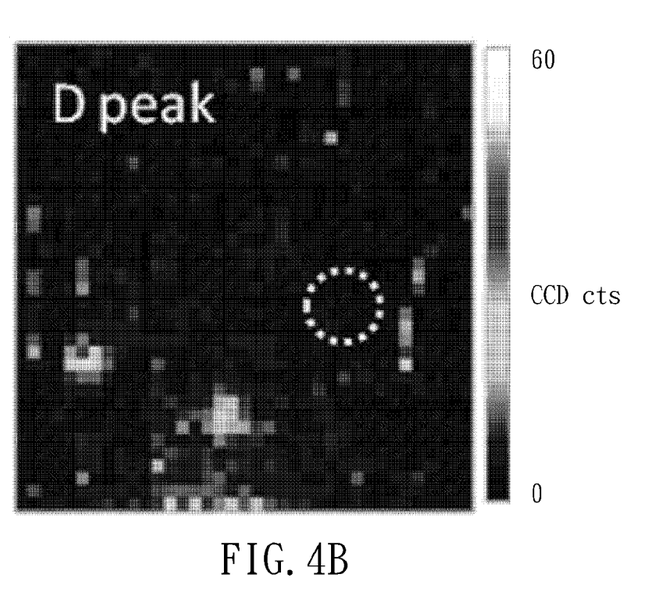
Figure 4C:
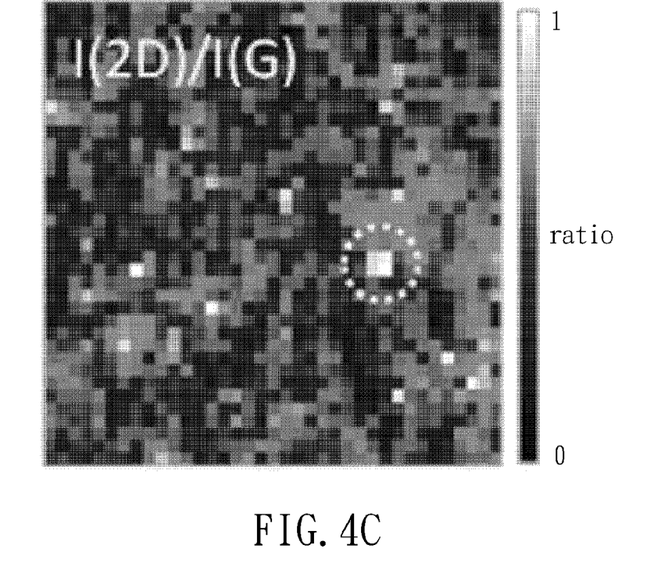
Figure 4D:
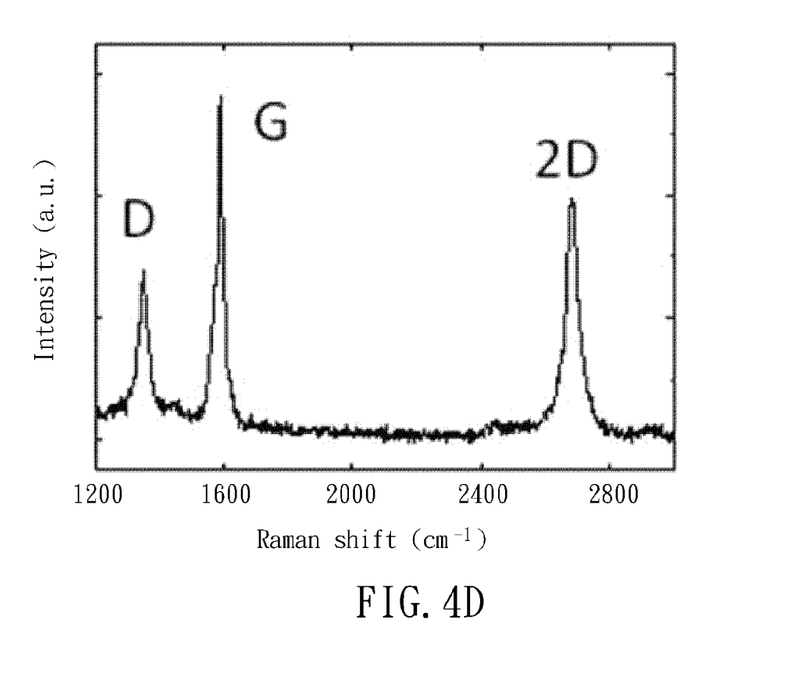

FIGS. 4A to 4C are two-dimensional Raman intensity maps of a graphene film grown by this invention, sequentially showing the G, D intensities, and the 2D to G intensity ratio ($I_{2D}/I_G$) in an area of 10 μm×10 μm. According to the invention's first preferred embodiment, the copper foils are used as the source of the copper vapor, and the graphene film is grown on the surface of the dielectric (silicon oxide) 15. According to the two-dimensional Raman map of the G peak shown in FIG. 4A, the graphene film is uniformly grown on the surface of the dielectric (silicon oxide) 15. According to the two-dimensional Raman map of the D peak shown in FIG. 4B, the defect density is low and distributed uniformly in the grown graphene structure, except for some spots with higher defect signals. The intensity ratio ($I_{2D}/I_G$) of FIG. 4C shows the crystalline quality of the graphene grown on the surface of the dielectric (silicon oxide) 15. The graphene coverage and the number of graphene layers are uniform on the dielectric 15. The Raman spectrum shown in FIG. 4D corresponds to the circled area of FIGS. 4A to 4C. The intensity of the 2D peak is close to that of the G peak, indicating that the grown graphene film has high crystalline quality with a thickness of only 1 to 2 layers.

Figure 5:
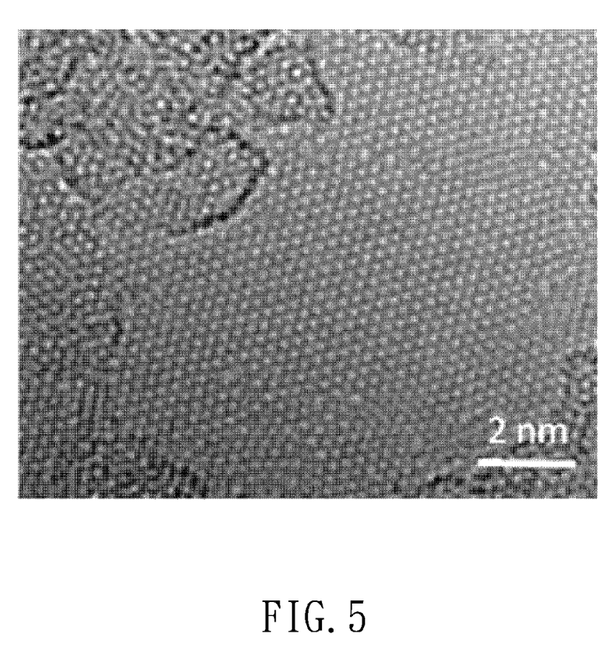
FIG. 5 is a high-resolution transmission electron microscopy image of graphene grown on a silicon oxide surface according to the preferred embodiment of the invention.

FIG. 5 is a high-resolution transmission electron microscopy image of graphene grown on the surface of a dielectric 15. This image clearly shows that the two-dimensional film grown on the surface of the silicon oxide in this embodiment is indeed monolayer graphene with high crystallinity.

In the second preferred embodiment of the invention, the seeds of graphite or graphene can be disposed on the dielectrics 15 before the dielectrics 15 are disposed in the reactor 11 to further enhance the quality of the formed graphene. In practice, the seeds of the graphite or graphene may be adhered to the dielectrics 15, or may be formed on the dielectrics 15 by chemical vapor deposition in combination with patterning.

Figure 6A:
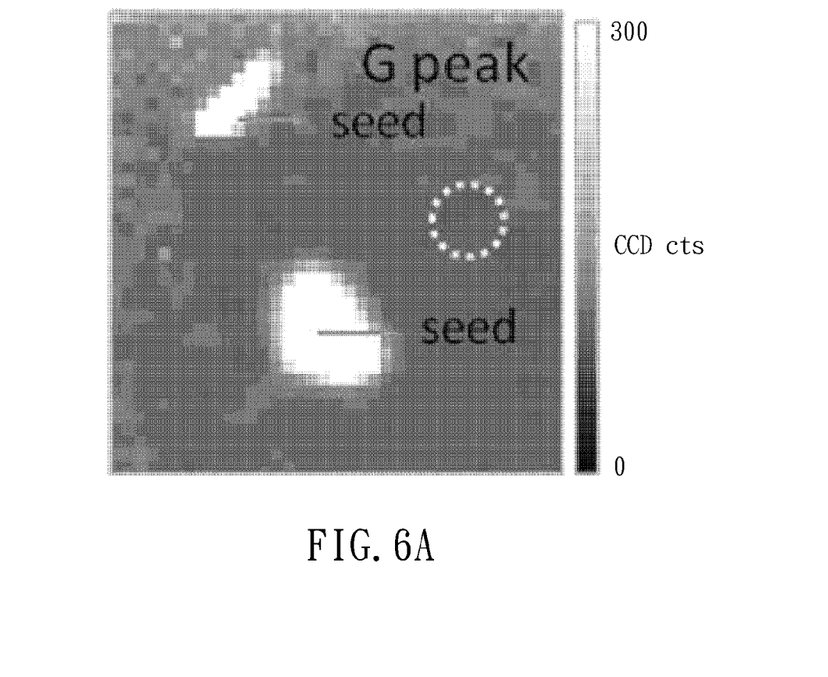
FIGS. 6A to 6C and 6D are respectively the two-dimensional Raman maps and spectrum of a graphene film grown on the surface of the silicon oxide with the graphite or graphene seed according to the preferred embodiment of the invention.
Figure 6B:
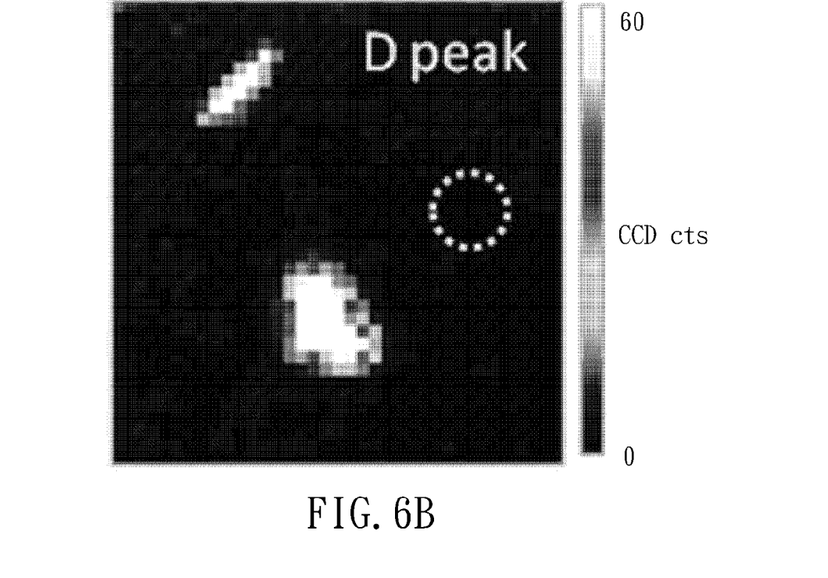
Figure 6C:
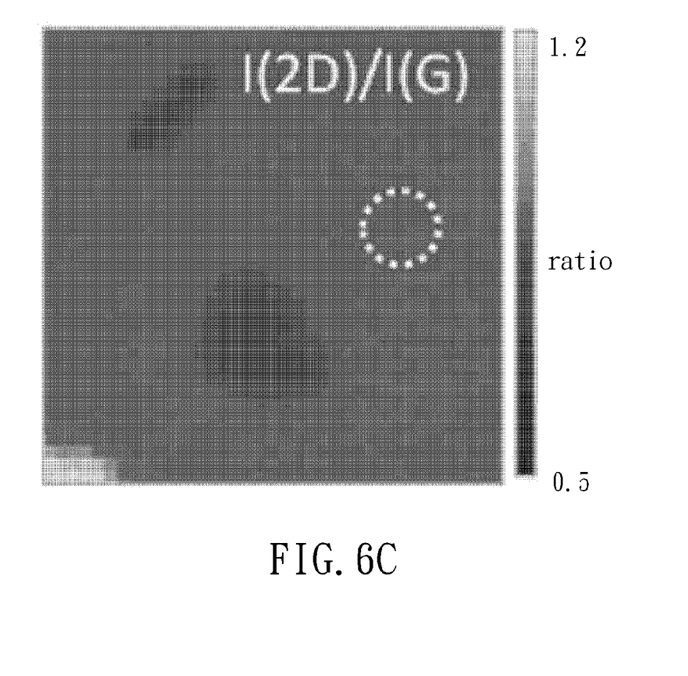
Figure 6D:
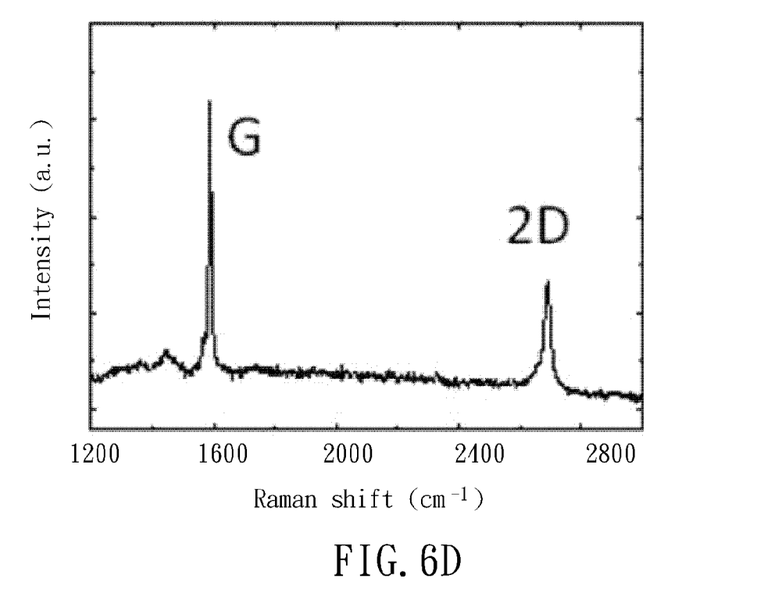

FIGS. 4A to 4C are two-dimensional Raman intensity maps of a graphene film grown by this invention, sequentially showing the G, D intensities, and the 2D to G intensity ratio ($I_{2D}/I_G$) in an area of 10 μm×10 μm. According to the invention's second preferred embodiment, the copper foils are used as the source of the copper vapor, and the graphene film is grown on the surface of the dielectric (silicon oxide) 15 with graphite or graphene serving as seeds. According to the two-dimensional Raman map of the G peak shown in FIG. 6A, the graphene film is uniformly grown on the surface of the dielectric (silicon oxide) 15. The film uniformity and quality are better than those obtained in the first preferred embodiment without seeding. According to the two-dimensional Raman map of the D peak shown in FIG. 6B, the defect density is lower compared to that obtained in the first preferred embodiment. The intensity ratio ($I_{2D}/I_G$) of FIG. 6C shows the crystalline quality of the graphene grown on the surface of the dielectric (silicon oxide) 15. The areas in the vicinity of the graphite seed exhibit very high crystalline quality and uniformity. The Raman spectrum shown in FIG. 46D corresponds to the circled area of FIGS. 6A to 6C. The intensity of the 2D peak is close to that of the G peak, indicating that the grown graphene film has high crystalline quality with a thickness of only 1 to 2 layers. According to the Raman spectrum shown in FIG. 6D, only very weak D peak appears, indicating that the graphene film grown on the surface of the silicon oxide with the graphite seeds has almost no defects. The grown graphene films thus show their great potential for application in biomedical, electronic and opto-electronic devices.

To sum up, the invention provides a method for growing graphene by chemical vapor deposition in which the vaporized metal particles are used as the catalysts and the reaction gases introduced into the reactor are decomposed by gas-phase collisions with the catalytic metal particles so that graphene films can be directly grown on the surfaces of the dielectric. This enhances manufacturing efficiency while maintaining the quality of the resulting graphene films.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of growing graphene by chemical vapor deposition comprising the following steps:
    disposing dielectric substrates in a reactor;
    providing metal vapors;
    introducing reaction gases into the reactor;
    heating the reaction gases to be decomposed; and
    depositing graphene films on surfaces of the dielectric substrates,
    wherein the graphene films are grown directly on the dielectric substrates, and no metal residues are left on the graphene films deposited on the surfaces of the dielectric substrates.

2. The method as recited in claim 1, wherein one of said metal vapors comprises one of the following: copper, nickel, zinc and a combination thereof.

3. The method as recited in claim 1, wherein one of said dielectric substrates comprises one of the following: silicon dioxide, quartz, sapphire, glass, sodium chloride, silicon nitride and a combination thereof.

4. The method as recited in claim 1, wherein the reaction gases are comprised of hydrogen and a carbon-containing gas.

5. The method as recited in claim 4, wherein one of said carbon-containing gases comprises one of the following: methane, acetylene, ethylene, benzene, carbon monoxide and carbon dioxide.

6. The method as recited in claim 4, comprising a further step of:
    introducing an inert gas into the reactor.

7. The method as recited in claim 6, wherein the inert gas flow rate ranges from 5 to 3000 sccm, while that of hydrogen ranges from 5 to 1000 sccm and that of the carbon-containing gas ranges from 5 to 1000 sccm.

8. The method as recited in claim 1, prior to the step of disposing the dielectrics in the reactor, comprising a further step of:
    treating the dielectrics using oxygen plasma.

9. The method as recited in claim 1, wherein the decomposition temperature of the reaction gases range from 200° C. to 1200° C.

10. The method as recited in claim 1, wherein the films deposited on the surfaces of the dielectrics are graphene or multilayer graphene.

11. The method as recited in claim 1, wherein seeds of graphite or graphene are disposed on the surfaces of the dielectrics before the dielectrics are disposed in the reactor.

* * * * *